United States Patent [19]

Voelker et al.

[11] Patent Number: 5,266,109
[45] Date of Patent: Nov. 30, 1993

[54] EMI SHIELDING PIGMENTS, A PROCESS FOR THEIR PREPARATION AND THEIR USE

[75] Inventors: Werner Voelker, Bad Vilbel; Wilan Jerke, Niederdorffelden; Kai Dorer, Heusenstamm; Bernd Dorbath, Alzenau; Karl A. Starz, Rodenbach; Norbert Giesecke, Bruchkoebel, all of Fed. Rep. of Germany

[73] Assignee: Degussa Aktiengesellschaft, Frankfurt am Main, Fed. Rep. of Germany

[21] Appl. No.: 917,318

[22] Filed: Jul. 23, 1992

[30] Foreign Application Priority Data

Jul. 24, 1991 [DE] Fed. Rep. of Germany ....... 4124458

[51] Int. Cl.$^5$ ............................................. C09C 1/24
[52] U.S. Cl. .................................. 106/459; 106/457; 106/456; 252/514
[58] Field of Search ............... 106/415, 418, 456, 459, 106/457; 252/514

[56] References Cited

U.S. PATENT DOCUMENTS

| 4,305,847 | 12/1981 | Stoezer et al. | 252/512 |
| 4,382,981 | 5/1983 | Stoetzer et al. | 427/105 |
| 4,517,118 | 5/1985 | Stoetzer | 252/513 |
| 4,518,524 | 5/1985 | Stoetzer | 252/514 |
| 4,867,795 | 9/1989 | Ostertag et al. | 106/459 |

FOREIGN PATENT DOCUMENTS 0343836 11/1989 European Pat. Off. .
3028114 2/1981 Fed. Rep. of Germany .
3709217 9/1988 Fed. Rep. of Germany .
59-086638 5/1984 Japan .
61-078873 4/1986 Japan .
62-028497 2/1987 Japan .
63-13303 1/1988 Japan .
63-020486 2/1988 Japan .
01095169 4/1989 Japan .

OTHER PUBLICATIONS

Patent abstract of Japan, vol. 12, No. 333, (C-526) to Agency of Ind. Science & Technol., Sep. 8, 1988.
Database WPIL, Derwent Publications Ltd., AN-8-9-359956 to Ishihara Sangyo Kaisha, Apr. 20, 1988.

*Primary Examiner*—Mark L. Bell
*Assistant Examiner*—Chris Gallo
*Attorney, Agent, or Firm*—Beveridge, Degrandi, Weilacher & Young

[57] ABSTRACT

New electromagnetic interference (EMI) shielding pigments based on silver coated carrier pigments are disclosed which have a wider activity spectrum and are more economically available than previously known shielding pigments. The carrier pigments used are platelet shaped, ferro- or ferrimagnetic, Fe-containing, naturally occurring or synthetically produced laminar minerals. The Ag coating amounts to 5 to 25% by weight, based on the carrier pigment. Shielding pigments, which may be prepared by conventional chemical deposition of Ag or by sputtering, may be used for the production of EMI protective coatings and EMI protective films.

24 Claims, No Drawings

EMI SHIELDING PIGMENTS, A PROCESS FOR THEIR PREPARATION AND THEIR USE

BACKGROUND OF THE INVENTION

This invention relates to EMI shielding pigments. Such pigments have a shielding effect against electric and magnetic fields in organic and inorganic coatings or films and thereby prevent electromagnetic interference (EMI). Coatings containing EMI shielding pigments on the housing or covering of an apparatus, protect an underlying substrate, for example, an electronic part or component, against electromagnetic energy from other sources. These coatings further prevent the escape of electromagnetic energy from the apparatus inside the housing.

It is known that pigments having ferro- or ferrimagnetic properties may be used for shielding against magnetic and low frequency electromagnetic fields. See, for example, German Patent Application No. 37 09 217 and Japanese Patent Application No. 61-078873 A2, which relates to Chemical Abstract No. 105 (16):135126c. These documents are entirely incorporated herein by reference. Non-ferromagnetic pigments which have good electrical conductivity can only be used for shielding against electric fields, and possibly high frequency electromagnetic fields. See, for example, German Patent Application No. 30 28 114 which is also entirely incorporated herein by reference.

For highly effective EMI protection over a wide frequency range of electromagnetic fields, both ferro-/ferrimagnetic pigments and electrically conductive pigments are incorporated in the coatings. An example of such coating is a ferrophosphorus alloy and nickel or silver, as disclosed in U.S. Pat. Nos. 4,517,118 and 4,518,524, which patents are entirely incorporated herein by reference. The disadvantages of the pigments in accordance with these patents are the great safety precautions required when working with carcinogenic nickel powder and/or the high cost of the required silver component. Instead of using two different pigments in coating compounds, it is sometimes possible to preserve the conductivity of the ferromagnetic materials and thereby improve the EMI protective action by metallizing a ferro- or ferrimagnetic pigment with a highly conductive metal. Thus, shielding pigments based on spherical or platelet shaped nickel particles which have a first coating of copper and a second coating of silver are disclosed in EP-A 0 343 836 (which is entirely incorporated herein by reference).

Japanese Patent Application No. 63-013303 A2 (which relates to Chemical Abstract No. 109 (14):120978r, each of which are incorporated entirely by reference) discloses highly conductive pigments based on silver-coated magnetite powder. These pigments contain from 30 to 70% by weight of Ag or Ag-Pd alloys, based on the iron oxide put into the process, and are used for the production of printed circuits. The use of these materials as shielding pigments and a platelet shaped structure of the pigments are not disclosed in these documents.

There have been many attempts to obtain shielding pigments having a platelet shaped structure, but known pigments of this type do not fulfil all expectations. Thus, for example, micas from the series of muscovite, phlogopite, sericite and oolithic mica have been metallized current-free. Ni-coated phlogopite, according to Japanese Patent Application No. 62-028497 A2 (which relates to Chemical Abstract No. 107 (10):79832g, which documents are entirely incorporated herein by reference), has a good shielding effect but is toxicologically suspect, like other Ni powders. Cu-coated muscovite and Cu-coated sericite require the use of organosilanes or organotitanates to avoid loss of activity by oxide formation, and the magnetic shielding effect is limited. See, Japanese Patent Application No. 59-086638 A2 (which relates to Chemical Abstract No. 101 (16):132088y) and Japanese Patent Application No. 01-095169 A2 (which relates to Chemical Abstract No. 111 (14):116368r), all of which are entirely incorporated herein by reference. Oolithic mica has also been silvered current-free for the preparation of electrically conductive pigments having a contact resistance below $10^{-3}$ $\Omega$·cm, as disclosed in Japanese Patent Application No. 63-020486 (which relates to Chemical Abstract No. 108 (22):1912752, each of which is entirely incorporated herein by reference).

SUMMARY OF THE INVENTION

It is an object of the present invention to provide new pigments for use as EMI shielding pigments which are highly effective in the low, medium and high frequency ranges. It is a further object to provide pigments which are free from nickel and are economically available.

DETAILED DESCRIPTION OF THE INVENTION

The electromagnetic interference (EMI) shielding pigments in accordance with one aspect of this invention have been found to include a platelet-shaped carrier pigment having a silver coating, wherein the carrier pigment is a platelet shaped, ferro- or ferrimagnetic, Fe-containing, naturally occurring or synthetic laminar mineral. The silver coating in the pigment amounts to 5 to 25% by weight, based on the carrier pigment.

Preferred carrier pigments have ferro- or ferrimagnetic structural elements of the type of $Fe_3O_4$; $\epsilon\cdot Fe_2O_3$; $\tau\cdot Fe_2O_3$; $MO\cdot Fe_2O_3$ wherein M stands for one or more divalent elements selected from Fe, Co, Ni, Mn, Mg, Cu and Zn; or $Mn_xAl_yFe_{[3-(x+y)]-z}O_{4-z}$ wherein $x=0.01-0.09$, $v=0.03$ and $z=0-1$ (see DE-OS 37 09 217). Platelet-shaped ferrite pigments rich in Fe may be obtained, for example, by the process of sintering haematite in the presence of manganese oxide and zinc oxide and a flux. The so-called micaceous iron ores are also very suitable, especially those consisting mainly of $Fe_2O_3$ (75–80%), $SiO_2$ (12.5–15%) and $Al_2O_3$ (3–5%).

The platelet shaped carrier pigments on which the shielding pigments according to the invention are based have a diameter to thickness ratio of at least 3 to 1, preferably greater than 5 to 1, and most preferably greater than 10 to 1. The diameter of preferred pigments in accordance with the invention is in the range of from 1 to 60 $\mu$m, and preferably from 5 to 30 $\mu$m. When naturally occurring laminar minerals are used as carrier pigments, they are ground down to the required grain spectrum or sieved before being metallized.

The EMI shielding pigments in accordance with the invention may be prepared by currentless deposition of silver on the carrier pigments or by the application of the silver by sputtering. In the case of chemical deposition of silver, the platelet shaped carrier pigments are mechanically kept afloat in an aqueous or organic solution containing silver. The dissolved, solvated Ag ions are then converted into the atomic state by a reducing agent, with the result that the silver coats the carrier pigment with a thin skin of metal. The term "dissolved, solvated Ag ions" is intended to refer to silver ions which are dissolved in the solvent (i.e., the aqueous or organic solution), wherein the silver ions are present in a solvated form, such as $[Ag(H_2O)]^+$ or $[Ag(solvent)_n]^+$. Examples of suitable reducing agents which may be used are: reducing carbonyl compounds such as aldehydes and ketones; hydroxycarboxylic acids and their salts, such as tartaric acid and ascorbic acid; reducing sugars, sulphites, dithionates, hydrazine, hydroxylamine and hydrides. If necessary, the carrier pigment may be activated in a known manner before the Ag coating, for example by means of activating metal salts, in particular tin(II) salts.

The sputtering process in accordance with the invention can be carried out by conventional sputtering techniques known in the art. For example, the sputtering process may take place under a vacuum in the range of 0.1 to 1 Pa. Because of the plate-like form of the basic material to be sputtered, the particles have to be turned several times from one side to the other.

The shielding pigments according to the invention have good conductivity which increases as the Ag coating is increased from 5% by weight to 25% by weight. A coating below 5% by weight produces only partially coated pigments with moderate conductivity. Increasing the Ag coating to amounts above 25% by weight does not significantly increase the conductivity. Based on the state of the art, one would expect that large quantities of Ag would be required for the coating. Surprisingly, large quantities of Ag are not necessary. In a magnetic field, the shielding pigments align themselves along the lines of the magnetic field.

The shielding pigments according to the invention may be used for the production of EMI protective coatings or protective films. During the application, the platelet-shaped pigments can be oriented, for example, by means of mechanical forces when a coating is applied to a substrate by a coating knife or during the extrusion of films. Alternatively, the platelet-shaped pigments can be oriented by means of magnetic forces. In this oriented arrangement, the pigment particles will make maximum contact with one another.

The protective coatings generally include (a) an effective quantity of the shielding pigment, (b) an organic or inorganic binder, (c) solvents and (d) optionally, processing auxiliaries such as hardeners, viscosity regulators, color pigments and hardening catalysts. The binder and shielding pigment are in most cases used in a ratio by weight of from 1:1 to 1:10. The binder used may be, for example, waterglass, silicones, thermoplastic acrylic, vinyl, urethane, alkyd, polyester, hydrocarbon or cellulose resins or duroplastic acrylic, polyester, phenol, urethane or epoxy resins. The use of these and similar binder resins and the processing of these resins to form coatings is well known to those skilled in the art, as shown, for example, in U.S. Pat. No. 4,518,524. The protective films may be produced in known manner by incorporating the shielding pigment in thermoplastic resins, such as polyethylene, polypropylene, polystyrene or acrylonitrile-butadiene styrene and extrusion or injection molding.

Some advantages of the EMI shielding pigments according to the invention lie in their wide activity spectrum, their ease of accessibility, their low cost of production and their physiological acceptability, as compared with materials containing nickel.

The invention will be described in conjunction with the following specific examples. These examples are intended to illustrate the invention and should not be construed as limiting the invention. The EMI shielding pigments described in these examples may be coated onto or applied to an apparatus housing or covering by techniques known to those skilled in the art.

EXAMPLES

EXAMPLE 1

This Example relates to a covering of a ferromagnetic pigment with 10% by weight of silver.

The ferromagnetic carrier pigment used in this Example is an iron oxide-containing, platelet shaped material based on micaceous iron ore having the following composition: $Fe_2O_3$ 79.2%; $SiO_2$ 14.5%; $Al_2O_3$ 4.5%; MgO 0.4%; $K_2O$ 0.8%; BaO 0.1%; CaO 0.2%; and $TiO_2$ 0.3%. The starting material was ground down to a particle size of less than 63 μm.

For coating the carrier pigment with silver, the carrier pigment is first activated with a solution of $SnCl_2$. For this purpose, 3.5 grams of $SnCl_2 \cdot 2 H_2O$ are introduced into 40 ml of VE water. The term "VE water" comes from the German term "Vollentsalztes Wasser," which means water after treatment with ion exchangers. This solution becomes clear after the addition for 3.5 grams of NaOH pellets. 50 grams of ferromagnetic carrier pigment are treated in this solution for 30 minutes at room temperature. The carrier pigment is then removed by suction filtration and washed free from chloride by means of VE water. The moist ferromagnetic carrier pigment is suspended in 80 ml of VE water and the mixture is heated to 65° C. The previously prepared silver solution and reducing solution are then added successively to this solution. The silver solution is prepared by dissolving 10 grams of $AgNO_3$ in 20 ml of VE water and then adding 11.5 ml of $NH_4OH$ 25% wt and then making up this solution to 50 ml. For the reducing solution, 8.25 grams of potassium sodium tartrate is dissolved in 20 ml of VE water, and the resulting solution is also heated to 65° C. before being added. The reduction mixture is stirred at 65° C. for 30 minutes. The material is then suction filtered, washed free from silver with VE water, then washed with ethanol and dried under vacuum at 80° C.

EXAMPLE 2

This Example relates to a covering of a ferromagnetic pigment with 20% by weight of silver.

The ferromagnetic carrier pigment used in this Example is an iron oxide-containing, platelet shaped material which has been screened to reduce the particle size to below 50 μm. Before being coated with silver, the carrier pigment is activated with an alkaline $SnCl_2$ solution for 30 minutes at room temperature and then washed free from chloride with VE water (the activating solution is 11 grams $SnCl_2 \cdot H_2O$ and 15 grams NaOH pellets in 100 ml of VE water). 100 grams of the activated carrier pigment are introduced moist into 200 ml of VE water to make a slurry. The speed of stirring must be adjusted so that all of the material is kept afloat. The reaction mixture should be at room temperature. A solution of 100 ml of VE water, 30 ml of $NH_4OH$ 25% wt and 31.4 grams of $AgNO_3$ then is added all at once and the two solutions are briefly mixed. A solution of 30 grams of glucose D(+) in 100 ml of VE water and 3 ml of $HNO_3$ 65% wt then is added immediately. The reaction mixture is stirred at room temperature for 30 minutes and then suction filtered, washed with VE water and dried at 80° C.

EXAMPLE 3

This Example relates to a covering of a ferromagnetic pigment with 25% by weight of silver.

The ferromagnetic carrier pigment used in this Example is an iron oxide-containing, platelet shaped material which has been screened to reduce the particle size to below 50 μm. The following solutions are prepared for coating 1.2 kg of carrier pigment with 25% by weight of silver:

Solution A: 474 grams of $AgNO_3$ are dissolved in 3 liters of VE water and reacted with 320 ml of $NH_4OH$ 25% wt. 95 grams of NaOH pellets dissolved in 1 liter of VE water then are added and the volume is made up 6.5 liters.

Solution B: 320 grams of Glucose D(+) are dissolved in 1 liter of VE water with the addition of 15 ml of $HNO_3$ 65% wt and the solution is then made up to 1.5 liter with VE water.

To produce the silver coating, 1.2 kg of carrier pigment are made up into a slurry in Solution A at room temperature. The speed of stirring should be adjusted to avoid the formation of a ground sediment as much as possible. Solution B then is added rapidly at room temperature. The particles sink after 5 minutes and no silver ions can be detected in the clear, supernatant solution. The material is suction filtered, washed and dried at 80° C.

The foregoing examples are intended to illustrate the invention and should not be construed as limiting the invention. Those skilled in the art will recognize that various modifications and changes can be made without departing from the spirit and scope of the invention.

The priority document, German Patent Application No. P 41 24 458.3 is relied on and entirely incorporated herein by reference.

We claim:

1. An electromagnetic interference shielding pigment, comprising: a platelet shaped carrier pigment with a silver coating, wherein the carrier pigment is a platelet shaped, ferromagnetic micaceous iron ore pigment, wherein the ferromagnetic micaceous iron ore pigment has an $Fe_2O_3$ content in the range of 75 to 80% by weight; a $SiO_2$ content in the range of 12.5 to 15% by weight; and an $Al_2O_3$ content in the range of 3-5%, and the silver coating amounts to 5 to 25% by weight, based on the carrier pigment weight.

2. The electromagnetic interference shielding pigment according to claim 1, wherein the carrier pigment is selected from the group of: $Fe_3O_4$; $\gamma Fe_2O_3$; $\delta Fe_2O_3$; $MO \cdot Fe_2O_3$ wherein M is one or more divalent elements selected from Fe, Co, Ni, Mn, Mg, Cu and Zn; or $Mn_xAl_vFe_{[3-(x+v)]-z}O_{4-z}$ wherein x is from 0.01 to 0.09, v is 0.03 and z is from 0 to 1.

3. The electromagnetic interference pigment according to claim 1, where the shielding pigments have a diameter to thickness ratio in the range of at least 3:1.

4. The electromagnetic interference pigment according to claim 3, wherein the ratio is greater than 5:1.

5. The electromagnetic interference pigment according to claim 3, wherein the ratio is greater than 10:1.

6. The electromagnetic interference pigment according to claim 1, wherein the diameter of the pigment is in the range of 1 to 60 μm.

7. The electromagnetic interference pigment according to claim 6, wherein the diameter of the pigment is in the range of 5-30 μm.

8. A process for the preparation of an electromagnetic interference shielding pigment having a platelet shaped carrier pigment with a silver coating, wherein the carrier pigment is a platelet shaped, ferro- or ferrimagnetic, Fe-containing, naturally occurring or synthetic laminar mineral and the silver coating amounts to 5 to 25% by weight, based on the carrier pigment weight, comprising:

contacting the platelet shaped carrier pigment with a silver containing solution;

adding a reducing agent, such that a silver deposit is chemically deposited on the platelet-shaped carrier pigment to thereby produce the electromagnetic interference shielding pigment.

9. The process according to claim 8, wherein the reducing agent is selected from the group of: reducing carbonyl aldehydes and ketones; hydroxycarboxylic acids and their salts; reducing sugars; sulphites; dithionates; hydrazine; hydroxylamine; and hydrides.

10. The process according to claim 8, further comprising the step of activating the carrier pigment with an activating metal salt prior to depositing the silver.

11. The process according to claim 10, wherein the activating metal salt is a tin(II) salt.

12. The process according to claim 11, wherein the tin(II) salt is a $SnCl_2$ solution.

13. The process according to claim 8, wherein the silver containing solution is an aqueous silver salt solution.

14. The process according to claim 13, wherein the aqueous silver salt solution is silver nitrate.

15. The process according to claim 8, wherein the reducing agent is produced from potassium sodium tartrate.

16. The process according to claim 8, wherein the reducing agent includes a solution of glucose D(+).

17. An electromagnetic interference protective coating comprising:

an electromagnetic interference shielding pigment including a platelet shaped carrier pigment with a silver coating, wherein the carrier pigment is a platelet shaped, ferromagnetic micaceous iron ore pigment, wherein the ferromagnetic micaceous iron ore pigment has an $Fe_2O_3$ content in the range of 75 to 80% by weight; a $SiO_2$ content in the range of 12.5 to 15% by weight; and an $Al_2O_3$ content in the range of 3-5%, and the silver coating amounts to 5 to 25% by weight, based on the carrier pigment weight; and an inorganic binder or an organic binder.

18. The electromagnetic interference protective coating according to claim 17, wherein the binder to pigment weight ratio is in the range of 1:1 to 1:10.

19. The electromagnetic interference protective coating according to claim 17, wherein the binder is selected from the group of waterglass, silicones, thermoplastic acrylic, vinyl, urethane, alkyd, polyester, hydrocarbon or cellulose resins or duroplastic acrylic, polyester, phenol, or epoxy resins.

20. An electromagnetic interference protective film comprising:

an electromagnetic interference shielding pigment including a platelet shaped carrier pigment with a silver coating, wherein the carrier pigment is a platelet shaped, ferromagnetic micaceous iron ore pigment, wherein the ferromagnetic micaceous iron ore pigment has an $Fe_2O_3$ content in the range of 75 to 80% by weight; a $SiO_2$ content in the range of 12.5 to 15% by weight; and an $Al_2O_3$ content in the range of 3-5%, and the silver coating amounts to 5 to 25% by weight, based on the carrier pigment weight; and a thermoplastic polymer which can be extruded or injection molded.

21. The electromagnetic interference protective film of claim 20, wherein the thermoplastic polymer is selected from the group of polyethylene, polypropylene, polystyrene and acrylonitrile butadiene styrene.

22. An electromagnetic interference shielding pigment, comprising: a platelet shaped carrier pigment with a silver coating, wherein the carrier pigment is a platelet shaped, ferromagnetic micaceous iron ore pigment, wherein the ferromagnetic micaceous iron ore pigment has an $Fe_2O_3$ content in the range of 75 to 80% by weight; a $SiO_2$ content in the range of 12.5 to 15% by weight; and an $Al_2O_3$ content in the range of 3-5%, and the silver coating amounts to 5 to 25% by weight, based on the carrier pigment weight;

the electromagnetic interference shielding pigment being produced by the process comprising;

contacting the platelet shaped carrier pigment with a silver solution;

adding a reducing agent, such that a silver deposit is chemically deposited on the platelet-shaped carrier pigment to thereby produce the electromagnetic interference shielding pigment.

23. The electromagnetic interference shielding pigment according to claim 22, further comprising an inorganic binder or an organic binder which is mixed with the pigment to thereby form an electromagnetic interference protective coating.

24. The electromagnetic interference shielding pigment according to claim 22, further comprising a thermoplastic polymer which can be extruded or injection molded which is mixed with the pigment to thereby form an electromagnetic interference protective film.

* * * * *